United States Patent
Bussan et al.

(10) Patent No.: US 8,261,368 B2
(45) Date of Patent: Sep. 4, 2012

(54) NANOMANUFACTURING DEVICES AND METHODS

(75) Inventors: John Edward Bussan, Naperville, IL (US); Michael R. Nelson, Libertyville, IL (US); Joseph S. Fragala, San Jose, CA (US); Albert K. Henning, Palo Alto, CA (US); Jeffrey R. Rendlen, Glen Ellyn, IL (US)

(73) Assignee: NanoInk, Inc., Skokie, IL (US)

( * ) Notice: Subject to any disclaimer, the term of this patent is extended or adjusted under 35 U.S.C. 154(b) by 622 days.

(21) Appl. No.: 12/465,621

(22) Filed: May 13, 2009

(65) Prior Publication Data

US 2010/0089869 A1 Apr. 15, 2010

Related U.S. Application Data

(60) Provisional application No. 61/052,864, filed on May 13, 2008, provisional application No. 61/167,853, filed on Apr. 8, 2009.

(51) Int. Cl.
*H01J 37/00* (2006.01)
*G01N 13/16* (2006.01)
*C23F 1/18* (2006.01)
*C23F 17/00* (2006.01)

(52) U.S. Cl. ........... 850/1; 850/5; 850/8; 435/1; 435/32; 438/14; 438/795; 118/712; 118/715; 216/2; 216/59

(58) Field of Classification Search ................ 850/1, 5, 850/8; 118/712, 715; 432/1, 32; 438/14, 438/795; 216/2, 59
See application file for complete search history.

(56) References Cited

U.S. PATENT DOCUMENTS

| | | | |
|---|---|---|---|
| 5,200,616 A | 4/1993 | Kokawa et al. | |
| 5,647,911 A | 7/1997 | Vanell et al. | |
| 6,437,328 B1 | 8/2002 | Knauss et al. | |
| 6,537,419 B1 | 3/2003 | Kinnard | |
| 6,635,311 B1 | 10/2003 | Mirkin et al. | |
| 6,674,074 B2 | 1/2004 | Schwartz | |
| 6,685,841 B2 * | 2/2004 | Lopez et al. | 210/767 |

(Continued)

FOREIGN PATENT DOCUMENTS

JP 2005-283188 A 10/2005

OTHER PUBLICATIONS

Advanced Inorganic Chemistry, 4th Ed., Cotton & Wilkinson (1980).

(Continued)

*Primary Examiner* — Nikita Wells
(74) *Attorney, Agent, or Firm* — Foley & Lardner LLP (57) ABSTRACT

Devices for performing nanofabrication are provided which provide small volume reaction space and high reaction versatility. A device may include a reaction chamber adapted for nanoscale modification of a substrate and vacuum conditions; a scanning probe tip assembly enclosed within the reaction chamber; a first port coupled to the reaction chamber for delivering a gas; a second port coupled to the reaction chamber for applying a vacuum; and a substrate assembly insertedly mounted to the reaction chamber. The reaction chamber may include a body having one or more flexible walls and one or more supports to prevent the reaction chamber from collapsing under a vacuum. The device may further include an electrical conduit for coupling the tips of the scanning probe tip assembly to electrical components outside the reaction chamber. Also provided are apparatuses incorporating the devices and methods of using the devices and apparatuses.

46 Claims, 6 Drawing Sheets

U.S. PATENT DOCUMENTS

| | | | |
|---|---|---|---|
| 6,827,979 B2 * | 12/2004 | Mirkin et al. | 427/256 |
| 6,942,753 B2 | 9/2005 | Choi et al. | |
| 7,251,987 B2 | 8/2007 | Watanabe et al. | |
| 7,253,408 B2 | 8/2007 | West | |
| 7,446,324 B2 | 11/2008 | Mirkin et al. | |
| 7,771,784 B2 * | 8/2010 | Loutfy et al. | 427/180 |
| 2002/0063212 A1 | 5/2002 | Mirkin et al. | |
| 2002/0122873 A1 | 9/2002 | Mirkin et al. | |
| 2009/0023607 A1 | 1/2009 | Rozhok et al. | |
| 2010/0059475 A1 * | 3/2010 | Mirkin et al. | 216/11 |

OTHER PUBLICATIONS

Bjarnason et al., "Cellbased ultra high vacuum scanning probe microscope with an external scanning unit having gas or liquid processing capabilities," J. Phys.: Conf. Series, vol. 100, No. 5, pp. 052011-1-052011-4 (2008).

Di Giovanni, Flat and Corrugated Diaphragm Design Handbook (1982).

Dobkin et al., Principles of Chemical Vapor Deposition, Kluwer Academic Publishers (2003).

Fair, Rapid Thermal Processing: Science and Technology, Academic Press, Inc. (1993).

Hicks et al., The Nanopositioning Book, Moving and Measuring to Better than a Nanometre (2000).

Madou, Fundamentals of Microfabrication, $2^{nd}$ Ed. (2002).

March's Advanced Organic Chemistry, $6^{th}$ Ed. (2007).

Rossnagel et al., Handbook of Plasma Processing Technology: Fundamental, Etching, Deposition and Surface Interactions, Noyes Publications (1990).

Scanning Probe Microscopies Beyond Imaging, Ed. P. Samori (2006).

Sree Harsha, Principles of Physical Vapor Deposition of Thin Films, Elsevier Ltd. (2006).

PCT/US2009/043862 filed May 13, 2009, International Search Report and Written Opinion dated Aug. 19, 2009 (14 pages).

* cited by examiner

NANOMANUFACTURING DEVICES AND METHODS

CROSS-REFERENCE TO RELATED APPLICATIONS

This application claims the benefit of U.S. Provisional Application No. 61/052,864, filed May 13, 2008, and U.S. Provisional Application No. 61/167,853, filed Apr. 8, 2009, both applications of which are incorporated herein by reference in their entirety, for any and all purposes.

BACKGROUND

Small scale manufacturing is an important aspect of the modern economy. For example, tip based fabrication can be used to make micro-, nano-, and atomic scale structures. Examples of interest include dots and lines in various shapes and patterns, multi-layer structures, quantum dots, nanoparticles, nanowires, nanotubes, and carbon nanotubes. Direct write methods are useful wherein a pattern can be directly drawn or embedded into a substrate surface. In one embodiment, material is transferred from a tip to a substrate using, for example, one or more nanoscopic, scanning probe, or atomic force microscope tips. Fabrication can be carried out to make a variety of structures including soft and hard structures, organic and inorganic structures, and biological structures. Imaging of structures on the small scale is also important. Instruments and devices can be fabricated which allow for both imaging and fabrication. See, for example, U.S. Pat. No. 7,253,408. Despite important advances, a need exists—particularly for commercial applications—to provide better devices and instruments which enable a broader array of fabrication methods, e.g., use of high temperatures or use of corrosive gases.

SUMMARY

Provided herein are devices, apparatuses, kits, methods of using, and methods of making.

One embodiment provides a device comprising: a reaction chamber adapted for nanoscale modification of a substrate and vacuum conditions; a scanning probe tip assembly enclosed within the reaction chamber, the scanning probe tip assembly comprising one or more tips; a first port coupled to the reaction chamber for delivering a gas; a second port coupled to the reaction chamber for applying a vacuum; and a substrate assembly insertedly mounted to the reaction chamber, wherein the reaction chamber comprises a body having one or more flexible walls adapted to accommodate the movement of the scanning probe tip assembly.

Another embodiment provides a device comprising: a reaction chamber adapted for nanoscale modification of a substrate and vacuum conditions; a tip assembly enclosed within the reaction chamber, the tip assembly comprising one or more tips; a first port coupled to the reaction chamber for delivering a gas; a second port coupled to the reaction chamber for applying a vacuum; and a substrate assembly insertedly mounted to the reaction chamber, wherein the reaction chamber comprises a body having one or more flexible walls adapted to accommodate the movement of the tip assembly.

Another embodiment provides a device comprising: a reaction chamber adapted for nanoscale modification of a substrate and vacuum conditions, the reaction chamber comprising a body having one or more flexible walls adapted to accommodate the movement of a scanning probe tip assembly, a cap portion mounted to a first end of the body, and a base portion mounted to a second, opposite end of the body, the base portion comprising a first aperture; the scanning probe tip assembly enclosed within the reaction chamber, the scanning probe tip assembly comprising one or more tips; a gas plate assembly mounted to the base portion of the reaction chamber, the gas plate assembly comprising a first port for delivering a gas, a second port for applying a vacuum, and a second aperture; a substrate assembly insertedly mounted through the first and second apertures; and a base assembly mounted to the substrate assembly, the base assembly adapted to adjust and maintain a height of the substrate assembly within the reaction chamber.

Another embodiment provides an apparatus comprising: a scanning probe nanolithography system, and a device mounted to the scanning probe nanolithography system, the device comprising a reaction chamber adapted for nanoscale modification of a substrate and vacuum conditions; a scanning probe tip assembly enclosed within the reaction chamber, the scanning probe tip assembly comprising one or more tips; a first port coupled to the reaction chamber for delivering a gas; a second port coupled to the reaction chamber for applying a vacuum; and a substrate assembly insertedly mounted to the reaction chamber, wherein the reaction chamber comprises a body having one or more flexible walls adapted to accommodate the movement of the scanning probe tip assembly.

Another embodiment provides a method comprising: providing a device comprising a reaction chamber adapted for nanoscale modification of a substrate and vacuum conditions; a scanning probe tip assembly enclosed within the reaction chamber, the scanning probe tip assembly comprising one or more tips; a first port coupled to the reaction chamber for delivering a gas; a second port coupled to the reaction chamber for applying a vacuum; and a substrate assembly insertedly mounted to the reaction chamber, wherein the reaction chamber comprises a body having one or more flexible walls adapted to accommodate the movement of the scanning probe tip assembly; and modifying a substrate mounted to the substrate assembly.

Another embodiment provides a method comprising: providing a device comprising a reaction chamber adapted for nanoscale modification of a substrate and vacuum conditions, the reaction chamber comprising a body having one or more flexible walls adapted to accommodate the movement of a scanning probe tip assembly, a cap portion mounted to a first end of the body, and a base portion mounted to a second, opposite end of the body, the base portion comprising a first aperture; the scanning probe tip assembly enclosed within the reaction chamber, the scanning probe tip assembly comprising one or more tips; a gas plate assembly mounted to the base portion of the reaction chamber, the gas plate assembly comprising a first port for delivering a gas, a second port for applying a vacuum, and a second aperture; a substrate assembly insertedly mounted through the first and second apertures; and a base assembly mounted to the substrate assembly, the base assembly adapted to adjust and maintain a height of the substrate assembly within the reaction chamber; and modifying a substrate mounted to the substrate assembly.

At least one advantage for at least one embodiment is ability to build micron and nanoscopic structures using more versatile conditions.

At least one advantage for at least one embodiment is ability to build micron and nanoscopic structures using hazardous and/or corrosive gases.

At least one advantage for at least one embodiment is ability to build micron and nanoscopic structures using vacuum and/or high temperatures.

At least one additional advantage for at least one embodiment is ability build structures in a small volume which allows for better control of the building process.

At least one additional advantage for at least one embodiment is ability to isolate electrical connections from extreme conditions including those of the reaction zone.

At least one additional advantage is ability to use the devices with existing commercial instrumentation.

DETAILED DESCRIPTION

Introduction

All references cited herein are incorporated by reference in the entirety.

Fabrication and Microfabrication at the small scale is generally known in the art. See, for example, Madou, *Fundamentals of Microfabrication*, $2^{nd}$ Ed., 2002. Both organic and inorganic structures can be fabricated. Organic compounds are described in, for example, *March's Advanced Organic Chemistry*, $6^{th}$ Ed., 2007 and can include low molecular weight compounds as well as polymeric compounds. Inorganic structures and materials are also known. See, for example, Cotton and Wilkinson, Advanced Inorganic Chemistry, $4^{th}$ Ed., 1980 and can include ceramics, glasses, metals, and the like.

A series of components can be assembled including a reaction chamber, a scanning probe tip assembly, one or more ports including a first port and a second port, and a substrate assembly.

Reaction Chamber

Reaction chambers are generally known in the art. They can be, for example, a main chamber or a cell chamber. See, for example, U.S. Pat. Nos. 7,253,408 and 5,200,616. Or they can be an atmosphere control chamber. See, for example, U.S. Pat. No. 6,674,074. Examples of reaction chambers are described further below and illustrated in the figures. Reaction chambers can be adapted to allow for detection inside the reaction chamber such as, for example, optical detection via a window. Reaction chambers can comprise multiple components such as, for example, a body, a wall, a cap, a base portion, a top portion, or a bottom portion. Reaction chambers can also be adapted to allow for electrical input and output from inside the reaction chamber. The reaction chamber can be adapted to allow for motion of components inside the reaction chamber including motion driven externally outside the reaction chamber.

Tip Assemblies and Scanning Probe Tip Assembly

Tip assemblies are generally known in the art and can be, for example, scanning probe tip assemblies. Tip assemblies can comprise an array of tips including single tips, one-dimensional array of tips, two-dimensional arrays of tips, including high density arrays of tips. See for example U.S. Pat. Nos. 6,635,311 and 6,827,979 to Mirkin et al. See also DPN 5000, NSCRIPTOR™ and other nanolithography instrumentation sold by NanoInk (Skokie, Ill.). Tips can be solid or hollow, and can have tip radius of, for example, less than 100 nm. Tips can be formed at the end of a cantilever structure, and the cantilever can be coupled to a holder, which can be subjected to motions.

Scanning probe tips and assemblies thereof are generally known in the art. See, for example, *Scanning Probe Microscopies Beyond Imaging*, Ed. P. Samori, 2006. A series of cantilevers can be used including tips disposed thereon. See, for example, U.S. Pat. No. 7,251,987. Examples of scanning probe tip assemblies are described further below and illustrated in the figures.

Tip assemblies and scanning probe tip assemblies can be adapted to move with nanopositioners such as piezoresistor nanopositioners. Motion can be in x, y, and z directions, as well as rotational motions. See, for example, US Patent Publication 2009/0023607 published Jan. 22, 2009 ("Compact Nanofabrication Apparatus"). See, for example, The *Nanopositioning Book. Moving and Measuring to Better than a Nanometre*, T. R. Hicks et al, 2000

First and Second Port

Ports are known in the art. See, for example, U.S. Pat. No. 6,437,328. A device can have a plurality of ports including for example a first port, a second port, and the like, different from each other. Examples of ports including first and second ports are described further below and illustrated in the figures. Ports can be, for example, openings which allow for materials to move from one space to another space such as, for example, entering and exiting a reaction chamber. The ports can be part of a larger assembly such as a plate assembly or a gas plate assembly.

Substrate Assembly

Substrate assemblies are known in the art. Substrate assemblies can hold samples which are subjected to imaging and/or fabrication. Samples can be coupled to the substrate assembly.

The substrate assembly can be adapted to move within a reaction chamber in one, two, or more directions, as well as with rotational and tilt motions.

These and other elements described herein can be assembled into devices, apparatuses, and kits. Use of the devices can be controlled by software, computers, and external hardware.

Devices

Figure 1:
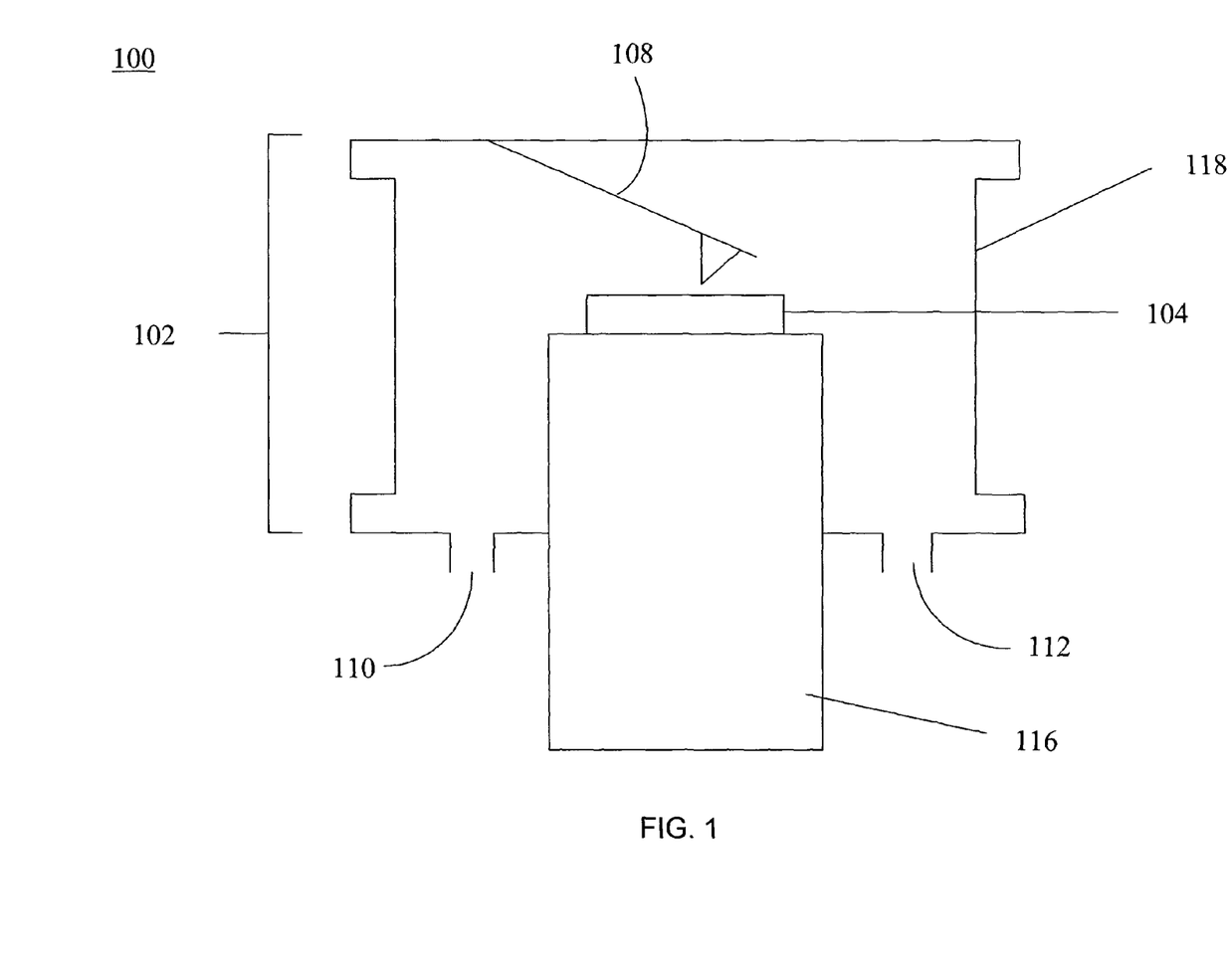
FIG. 1 is a view of an exemplary embodiment of a device for performing scanning probe nanolithography, one or more surface modification methods, or combinations thereof.

For example, in one aspect, devices for performing scanning probe nanolithography, one or more surface modification methods, or combinations thereof are provided. An embodiment of such a device is illustrated in FIG. 1. As shown in FIG. 1, the device 100 includes a reaction chamber 102 adapted for nanoscale modification of a substrate 104 and vacuum conditions. The vacuum conditions may be low vacuum, medium vacuum, or high vacuum conditions. In some embodiments, the vacuum conditions are high vacuum conditions. The device may also include a scanning probe tip assembly 108 enclosed within the reaction chamber 102; a first port 110 coupled to the reaction chamber for delivering a gas; a second port 112 for applying a vacuum; and a substrate assembly 116 insertedly mounted to the reaction chamber. The device can be adapted to allow for optical access (not shown) to the inside and into the reaction chamber.

The reaction chamber may include a body 118 having one or more flexible walls adapted to accommodate the movement of the scanning probe tip assembly. Flexibility may be achieved by choice of materials for the walls, the dimensions of the walls, the shapes of the walls, or combinations thereof. By way of example only, the walls may be corrugated to allow for expansion and contraction of the walls both in the vertical and horizontal direction. For those embodiments in which the walls of the reaction chamber are flexible, the reaction chamber may further include one or more supports mounted to the outside of the reaction chamber to prevent the reaction chamber from collapsing under a vacuum.

Corrugated structures are known in the art. See, for example, Di Giovanni, *Flat and Corrugated Diaphragm Design Handbook*, 1982.

The reaction chamber may be adapted to be stable to a corrosive gas, a high temperature, or combinations thereof By way of example only, the entire reaction chamber, or components of the reaction chamber, may be formed of materials which can withstand high temperatures (e.g., temperatures ranging from about 200° C. to about 1300° C.) and/or corrosive gases. Such materials include, but are not limited to stainless steel, silicon, and polydimethylsiloxane.

As shown in FIG. 1, a portion of the substrate assembly 116 remains outside of the reaction chamber 102. This is in direct contrast to conventional scanning probe microscopes having vacuum and/or gas capabilities in which the reaction chamber encloses the entire substrate assembly. As a result, the disclosed reaction chambers have a significantly smaller volume, enabling rapid control over the conditions inside the reaction chamber, (e.g., the temperature, pressure, and gas composition). In some embodiments, the volume of the reaction chamber is about 1 cubic inch or less. This includes embodiments in which the volume of the reaction chamber ranges from about 0.4 cubic inches to about 1 cubic inch, from about 0.3 cubic inches to about 0.9 cubic inches, from about 0.4 cubic inches to about 0.8 cubic inches, and from about 0.5 cubic inches to about 0.7 cubic inches. However, other volumes are possible. In fact, maximum volume of reaction chamber is not particularly limited.

The devices may further include an electrical conduit for coupling the one or more tips of the scanning probe tip assembly to one or more electrical components outside the reaction chamber. Electrical components include, but are not limited to, voltage sources, current sources, and devices for measuring voltage and current. These electrical components may be used to heat and/or to electrically bias the scanning probe tips. Exemplary electrical conduits are described below. However, they share the feature of enabling electrical connections to the tips be separated from the potentially hazardous conditions inside the reaction chamber.

The term "mount" can include include, for example, join, unite, connect, associate, insert, hang, hold, affix, attach, fasten, bind, paste, secure, bolt, screw, rivet, solder, weld, press against, and other like terms.

The term "vacuum conditions" can refer to conditions in which the measured pressure is less than atmospheric pressure (760 Torr). Vacuum conditions encompasses low vacuum conditions (e.g., about 760 Torr to about 25 Torr), medium vacuum conditions (e.g., about 25 Torr to about $1 \times 10^{-3}$ Torr), and high vacuum conditions (e.g., about $1 \times 10^{-3}$ Torr to about $1 \times 10^{-9}$ Torr).

Additional Devices

Figure 2:
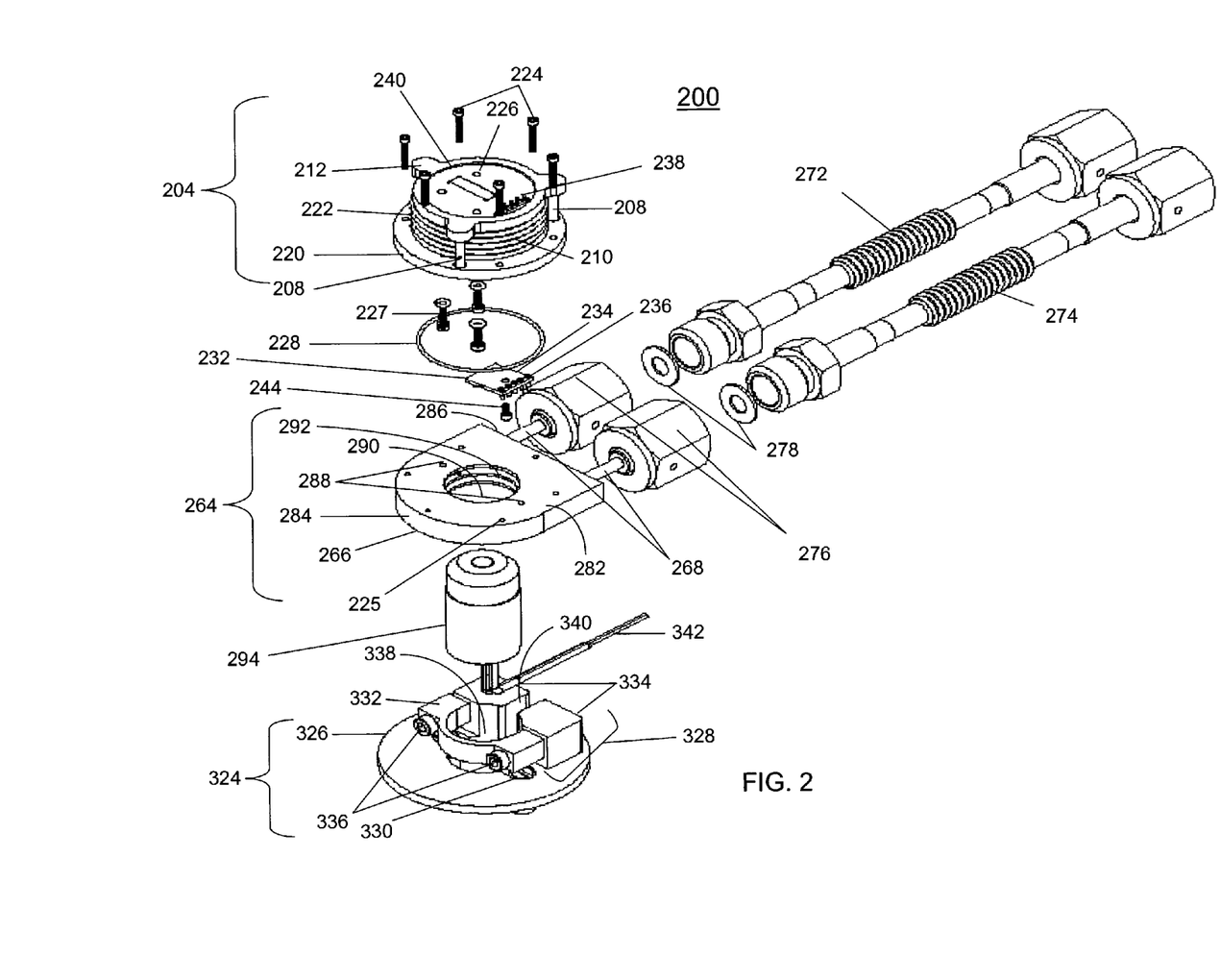
FIG. 2 a disassembled, exemplary embodiment of a device for performing scanning probe nanolithography, one or more surface modification methods, or combinations thereof. The device includes a reaction chamber, a scanning probe tip assembly, a gas plate assembly, a substrate assembly, and a base assembly.

The devices are further described with reference to the non-limiting, exemplary embodiments shown in FIGS. 2-4. A disassembled view of an exemplary device 200 is shown in FIG. 2. The device 200 may include a reaction chamber 204, a scanning probe tip assembly 232, a gas plate assembly 264, a substrate assembly 294, and a base assembly 324.

Figure 3A:
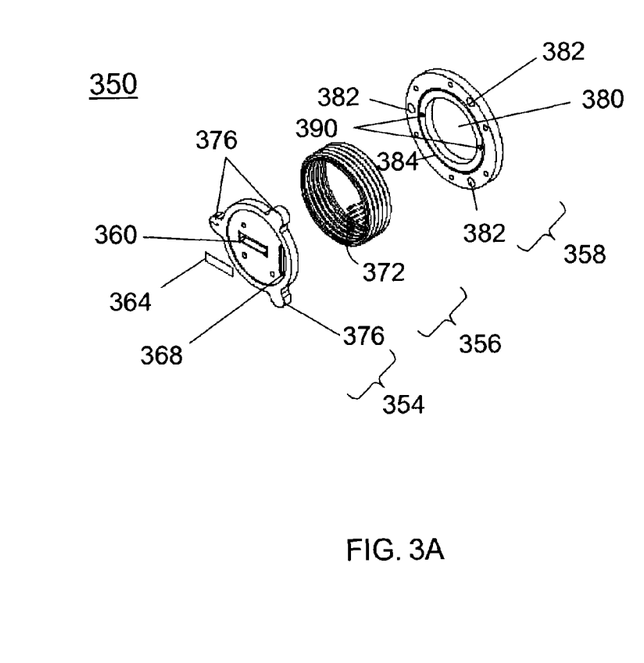
FIG. 3A is a view of a disassembled, exemplary embodiment of a reaction chamber including a cap portion, a body, and a base portion.
Figure 4A:
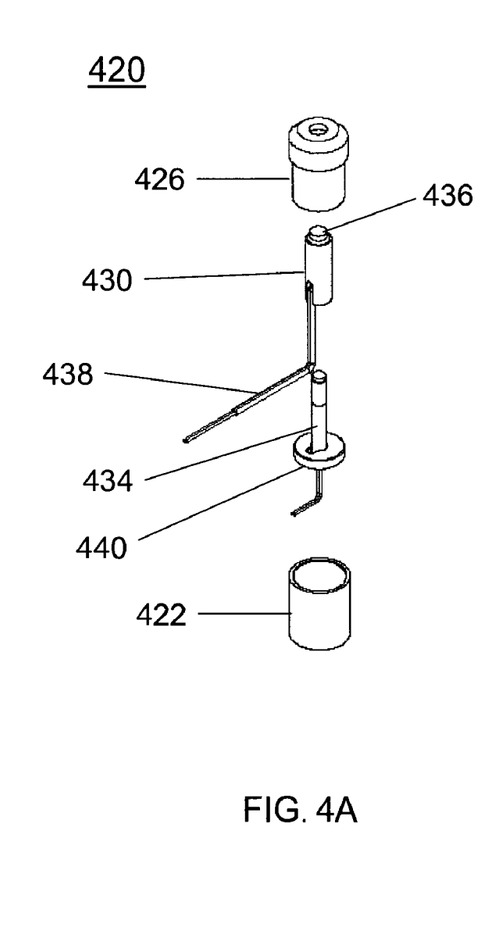
FIG. 4A is view of a disassembled, exemplary embodiment of a substrate assembly including a body, a heating element, an insulating sleeve, an insulating washer, and a housing.

An exemplary reaction chamber 204 is shown in FIG. 2 and FIG. 3. Starting with FIG. 3A, this figure shows a disassembled, exploded view of an exemplary reaction chamber 350. The reaction chamber 350 may include a cap portion 354, a body 356, and a base portion 358. The cap portion 354 may be a variety of shapes and sizes. As shown in FIG. 3A, the cap portion 354 may be disk shaped. The cap portion 354 may include a first aperture 360 shaped to accommodate a transparent window 364. The transparent window 364 may be used to view the scanning probe tip assembly (element 232 in FIG. 2) and to align a laser on the scanning probe tip assembly for detecting the position of the assembly. The cap portion 354 may also include a second aperture 368 shaped to allow one or more pins 372 mounted to the body 356 to pass through the cap portion 354 to the outside of the reaction chamber. These pins 372 are further described below. The cap portion 354 may further include one or more protrusions 376 along the perimeter of the cap portion. As shown in FIG. 2, these protrusions may be used to mount one or more supports 208. The supports 208 may be used to prevent the body 210 of the reaction chamber from collapsing under vacuum. The supports 208 may be rods that have a threaded end which may be screwed into a threaded hole or aperture (not shown) in the protrusions 212. However, other supports, including springs, and mounting means are possible. With reference to FIG. 3A, the underside of the cap portion 354 may include a channel (not shown) for mounting the body 356.

FIG. 3A also shows an exemplary body 356 of the reaction chamber 350. The body 356 may be a hollow, cylindrical tube having corrugated walls. However, other shapes are possible. As noted above, the corrugation may impart flexibility to the body 356, which is useful to accommodate motion of the body or other components of the reaction chamber during use. The body 356 may also include one or more pins 372 mounted to the inner surface of the body. These pins 372 may be used to provide an electrical conduit connecting one or more electrical components to the tips of the scanning probe tip assembly (element 232 in FIG. 2). As discussed above, these electrical components include, but are not limited to, voltage sources, current sources, and devices for measuring voltage and current. These pins allow such electrical connections to the tips to be separated from the potentially hazardous conditions inside the reaction chamber.

FIG. 3A also shows an exemplary base portion 358. The base portion 358 may take on a variety of shapes and sizes. As shown in FIG. 3A, the base portion 358 may be ring-shaped so that the substrate assembly (element 294 in FIG. 2) may pass through an aperture 380 in the base portion. The top surface of the base portion 358 may include one or more holes 382 along the perimeter of the base portion for mounting the supports 208 described above. The top surface may also include a channel 384 for mounting the body 356. The body 356 may be mounted to the channel 384 by an adhesive, including, but not limited to silver filled high vacuum material bonding, Dynaloy® 325 part A & B.

Figure 3B:
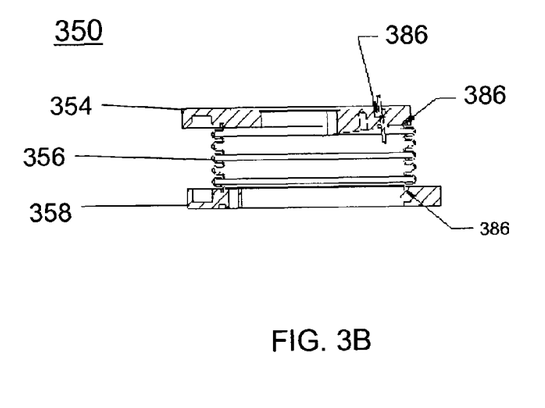
FIG. 3B is a view of the substrate assembly of FIG. 3A, as assembled.

FIG. 3B shows a cross-section of an assembled, exemplary reaction chamber 350, including the cap portion 354, the body 356, and the base portion 358. The dimensions of each of the components may be such that the components fit securely together by simply pressing the components together. However, a sealant 386 may be used to secure certain components of the reaction chamber 350 together. As shown in FIG. 3B, sealant 386 may be used between the pins 372 and the cap portion 354 and between the ends of body 356 and the channels in the cap portion 354 and the base portion 358.

The materials for each of the components of the reaction chamber 350 may vary. In some embodiments, the materials are those which can withstand high temperatures (e.g., temperatures ranging from about 200° C. to about 1300° C.) and hazardous and/or corrosive gases. By way of example only, the cap portion 354, the body 356, and the base portion 358 may be formed of stainless steel. The body 356 may also be formed of other materials, including, but not limited to silicon, polydimethylsiloxane, nickel, Inconel, or Hastelloy®. The O-ring may be a Kalrez® perfluoroelastomer O-ring or a PTFE O-ring. However, the O-ring may be formed of other materials, depending upon the choice of gases and temperatures used in the reaction chamber. The pins 372 may be formed of a conductor, including, but not limited to copper, beryllium copper, gold plated nickel, or soft gold plated beryllium copper. Suitable sealants include, but are not limited to Krytox® vacuum grease.

FIG. 2 also shows an exemplary scanning probe tip assembly 232. The scanning probe tip assembly 232 may include a body 234 for mounting one or more scanning probe tips (not shown) to the end of the body. The body 234 may have a variety of shapes and sizes. As shown in FIG. 2, the body 234 is rectangular, but other shapes are possible. The scanning probe tip assembly 232 may further include one or more receptacles 236 mounted at the end of the body 234 for mounting the one or more pins 238 mounted on the body 210 of the reaction chamber 204. These receptacles may also be used to mount one or scanning probe tips. Thus, the receptacles 236 serve at least two purposes, including providing a pathway for electrical connections to the scanning probe tips and mechanically supporting the scanning probe tip assembly 232 to the cap portion 240 of the reaction chamber 204. To couple any of the electrical components described above to the scanning probe tip assembly, the printed circuit board (PCB) of the scanning probe tip assembly 232 may be wire bonded directly to the receptacles 236. The receptacles 236 may be plated with soft gold for this purpose. Other means of coupling the electrical components to the scanning probe tip assembly are possible. A variety of scanning probe tips may be used, including, but not limited to those disclosed in U.S. Pat. No. 7,446,324, which is hereby incorporated by reference in its entirety. The scanning probe tip assembly 232 may include only a single scanning probe tip. Alternatively, the scanning probe tip assembly 232 may include a 1-dimensional array or a 2-dimensional array of scanning probe tips. The scanning probe tip assembly 232 may be mounted to the underside of the cap portion 240 of the reaction chamber 204. By way of example only, the scanning probe tip assembly 232 may be mounted by a screw 244 inserted into a socket (not shown) on the underside of the cap portion 240. However, other mounting means are possible.

The materials for each of the components of the scanning probe tip assembly 232 may vary. In some embodiments, the materials are those which can withstand high temperatures (e.g., temperatures ranging from about 200° C. to about 1300° C.) and hazardous and/or corrosive gases. By way of example only, the body 234 may be formed of a high temperature PCB such as Rodgers PPT, or a ultra-high temperature "Macor" ceramic. The receptacles 236 may be formed of a conductor, including, but not limited to copper, beryllium copper, gold plated nickel, or soft gold plated beryllium copper.

Plate assemblies such as gas plate assemblies for gas distribution or diffusion are known in the art. See, for example, U.S. Pat. Nos. 5,647,911; 6,537,419; and 6,942,753. FIG. 2 also shows an exemplary gas plate assembly 264. The gas plate assembly 264 may include a body 266 and first and second ports 268. One of the ports 268 may be coupled to a reaction gas source (not shown) through a first hose assembly 272. The other port 268 may be coupled to a vacuum pump (not shown) through a second hose assembly 274. The hose assemblies may be flexible hose assemblies. Swagelok® accessories 276 or other similar accessories and gaskets 278 between the ports 268 and the respective hose assemblies 272 and 274 may be used to form a seal capable of maintaining a vacuum.

The body 266 of the gas plate assembly 264 may have a variety of shapes and sizes. As shown in FIG. 2, the body 266 may have a flat top surface 282. One side 284 of the body 266 may be curved and the other side 286, which may include the ports 268, may be flat. However, other shapes are possible. Similarly, the body 266 may include more than two ports. By way of example only, multiple gases may be delivered through multiple ports. The top surface 282 may include one or more openings 288 through which gases may pass. The body 266 may also include a central aperture 290 through which the substrate assembly 294 may be insertedly mounted. The central aperture 290 may have a variety of shapes, depending upon the shape of the substrate assembly 294. As shown in FIG. 2, the central aperture 290 may be circular. The body 266 may also include one or more channels 292 formed on the inside wall of the central aperture 290 to accommodate one or more O-rings to form a seal between the body 266 and the substrate assembly 294. The seal may be capable of maintaining a vacuum.

The materials for each of the components of the gas plate assembly 264 may vary. In some embodiments, the materials are those which can withstand high temperatures (e.g., temperatures ranging from about 200° C. to about 1300° C.) and hazardous and/or corrosive gases. By way of example only, body 266 and the hose assemblies 272 and 274 may be formed of stainless steel. The O-rings may be Kalrez® perfluoroelastomer O-rings, or any of the O-rings described above.

With reference to FIG. 2, the reaction chamber 204 may be mounted to the body 266 of the gas plate assembly 264. The base portion 220 of the reaction chamber 204 may include one or more apertures 222 along the perimeter of the base portion through which screws 224 may pass. As shown in FIG. 2, these screws 224 may be used to mount the base portion 220 of the reaction chamber 204 to threaded holes 225 in the body 266 of the gas plate assembly 264. However, other mounting means are possible. An O-ring 228 may be used to form a seal capable of maintaining a vacuum when the base portion 220 of the reaction chamber 204 is mounted onto the body 266 of the gas plate assembly 264.

As shown in FIG. 3A, the base portion 358 of the reaction chamber 350 may include one or more openings 390 through which gases may pass. These openings 390 may be aligned with the openings 288 in the body 266 of the gas plate assembly 264, as shown in FIG. 1. Thus, gases may be delivered and a vacuum maintained in the reaction chamber via the gas plate assembly.

With reference to FIG. 2, the reaction chamber 204 may also be mounted to the XYZ scanner of a microscope (not shown). The cap portion 240 of the reaction chamber 204 may include one or more apertures 226 through which one or more screws 227 may pass for mounting onto a microscope scanner. However, other mounting means are possible. The screws 227 may include one or more O-rings to form a seal capable of maintaining a vacuum.

FIG. 2 also shows an exemplary substrate assembly 294. A substrate assembly 420 is shown in more detail in FIG. 4. FIG. 4A shows a disassembled, exploded view of an exemplary substrate assembly 420. The substrate assembly 420 may include a housing 422, an insulating sleeve 426, a body 430, and a heating element 434.

The body 430 may have a variety of shapes and sizes. As shown in FIG. 4A, the body 430 may be cylindrical in shape. The body 430 may include a platform 436 disposed at an end of the body. A substrate may be mounted to the platform. The body 430 may further include a temperature sensor 438, such as a thermocouple, for monitoring the temperature of the substrate. The body 430 may be hollow to accommodate the insertion of a heating element 434 for controlling the temperature of the substrate. The right angle accessories coupled to the heating element 434 in FIG. 4A are the heating element's electrical leads. A variety of heating elements may be used. By way of example only, any of the McMaster-Carr® brand miniature high temperature cartridge heaters may be used, at least some of which are able to achieve temperatures from about ambient to about 760° C. Other heating elements include, but are not limited to Watlow® brand heaters, such as a nichrome wire wrapped ceramic, minco thin film type heating element, at least some of which are able to achieve temperatures from ambient to about 600° C.

The substrate assembly 420 may include an insulating sleeve 426, which may be disposed around the body 430. The insulating sleeve 426 may serve to insulate the heated body 430 and platform 436 from the other components of the device. A variety of shapes and sizes are possible for the insulating sleeve 426, depending upon the shape and size of the other components of the substrate assembly 420. As shown in FIG. 4A, the insulating sleeve 426 may be cylindrically shaped. The substrate assembly 420 may further include an insulating washer 440 disposed around an end of the heating element 434 for further insulation of the heated body 430 and platform 436 from the other components of the device. The substrate assembly 420 may further include a housing 422, which may be disposed around the insulating sleeve 426.

Figure 4B:
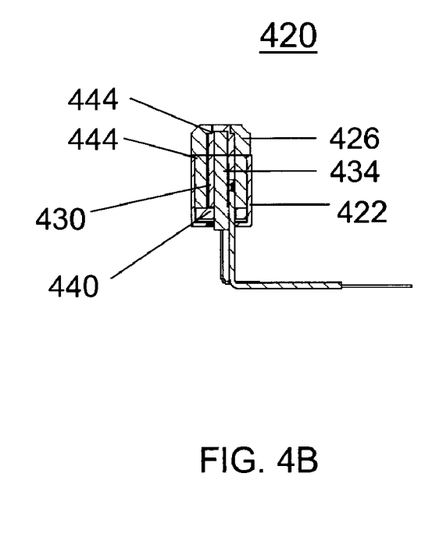
FIG. 4B is a view of the reaction chamber of FIG. 4A, as assembled.

A cross-section of the assembled substrate assembly 420 is shown in FIG. 4B, including the housing 422, the insulating sleeve 426, the body 430, the heating element 434, and the insulating washer 440. The dimensions of each of the components of the substrate assembly 420 may be such that each component fits securely together by pressing the components together. However, a sealant 444 may be used to secure certain components together. As shown in FIG. 4B, sealant 444 may be used between the insulating sleeve 426 and the body 430 and the insulating sleeve 426 and the housing 422.

The materials for each of the components of the substrate assembly 420 may vary. By way of example only, the body 430 and the platform 436 may be formed from a high thermal conductive material, including, but not limited to copper. The insulating sleeve 426 and the insulating washer 440 may be formed from any number of machine able high temperature ceramics, such as Macor®. The housing 422 may be formed from any number of corrosion-resistant stainless steels such as types 316 or 316L or from materials such as Hastelloy®. Suitable sealants include, but are not limited to Krytox® vacuum grease.

FIG. 2 also shows an exemplary base assembly 324. The base assembly 324 may be adapted to adjust and maintain a height of the substrate assembly 294 within the reaction chamber 204. The base assembly 324 may be further adapted to mount to the stage of a microscope (not shown). The base assembly 324 may have a variety of configurations. By way of example only, the base assembly 324 may include a base portion 326 for supporting the substrate assembly 294 on a horizontal surface and an adjustable mounting portion 328 for adjusting and maintaining the substrate assembly 294 at a particular height. The base portion 326 may have a variety of shapes and sizes. As shown in FIG. 2, the base portion 326 may be ring-shaped with an aperture through which the substrate assembly 294 may pass. The base portion 326 may be mounted to a microscope stage using one or more screws 330. However, other means for mounting are possible.

Similarly, the adjustable mounting portion 328 may have a variety of shapes and sizes. As shown in FIG. 2, the adjustable mounting portion 328 may include a clamping portion 332 and a supporting portion 334. The supporting portion 334 may be an integral piece of the base portion 326, or the supporting portion 324 may be a separate piece that can be mounted to the base portion 326. The clamping portion 332 may be a separate piece that can be mounted to the supporting portion 334. The clamping portion 332 may be mounted to the supporting portion 334 by one or screws 336. However, other means for mounting are possible. The supporting portion 334 and the clamping portion 332 may be shaped in such a way to provide an aperture 338 through which the substrate assembly 294 may be insertedly mounted. As shown in FIG. 2, this aperture 338 may be circular. However, other shapes are possible, depending upon the shape of the substrate assembly 294. The substrate assembly 294 may be placed into the aperture 338, adjusted to the desired height, and fixed in place by mounting the clamping portion 332 to the supporting portion 334. As shown in FIG. 2, the supporting portion 334 may be further shaped to include a channel 340 to accommodate certain accessories 342 of the substrate assembly 294. These accessories are described above, with reference to FIG. 4 (see element 438).

A variety of materials may be used for the components of the base assembly 294. In some embodiments, the materials are those which can withstand high temperatures (e.g., temperatures ranging from about 200° C. to about 1300° C.) and hazardous and/or corrosive reactant gases. By way of example only, a suitable material may be stainless steel or Hastelloy®. However, other materials are possible since the base assembly 294 is relatively isolated from the extreme conditions of the reaction chamber 204.

Figure 6:
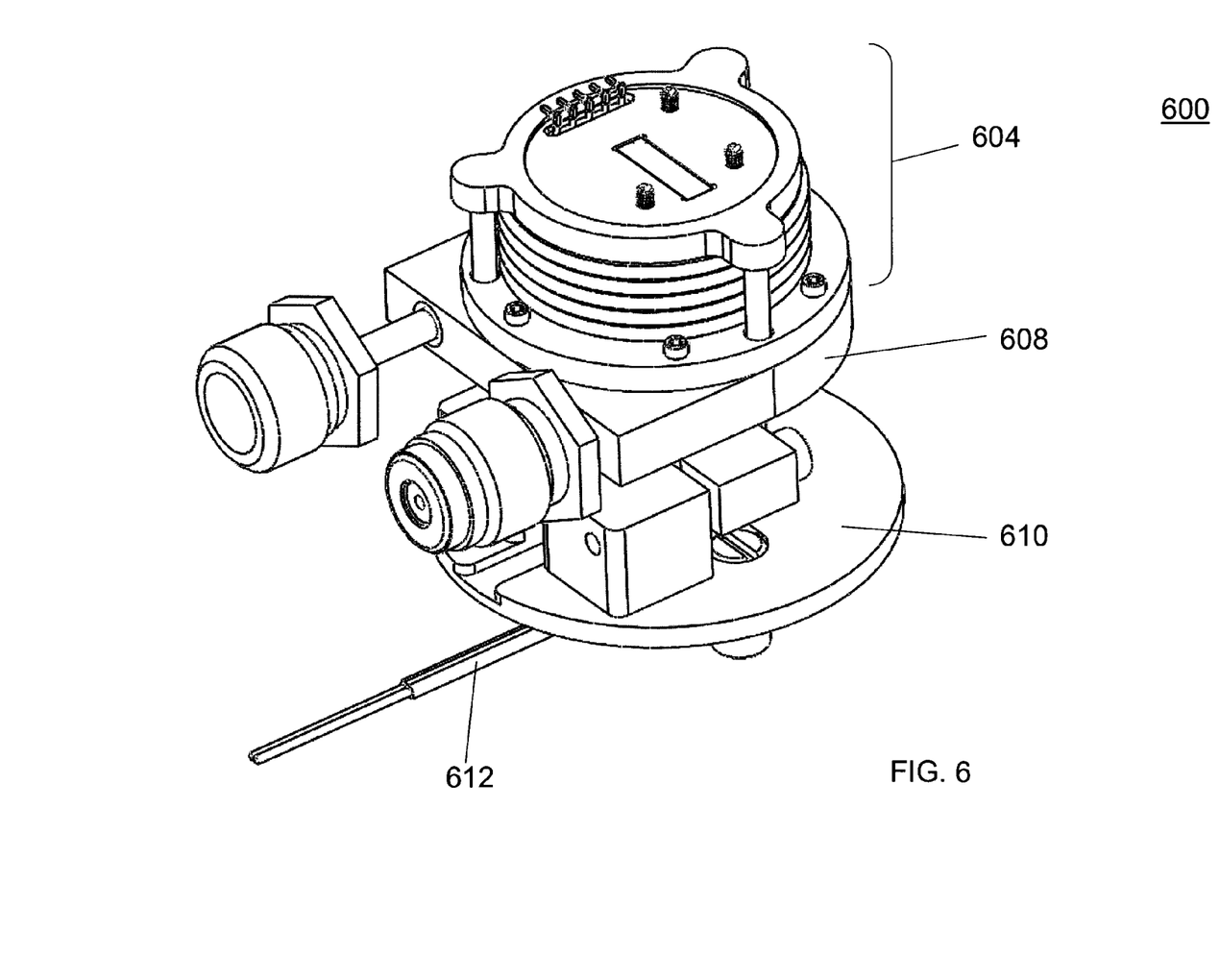
FIG. 6 is a view of an assembled, exemplary embodiment of a device for performing scanning probe nanolithography, one or more surface modification methods, or combinations thereof.

FIG. 6 shows an exemplary embodiment of an assembled device 600. The device 600 includes the reaction chamber 604, the scanning probe tip assembly (not shown, enclosed in the reaction chamber), the gas plate assembly 608, the substrate assembly (not shown, insertedly mounted to the reaction chamber), and the base assembly 610. The right angle accessories 612 of the heater element are also shown.

Apparatuses

In another aspect, apparatuses incorporating the disclosed devices are proved. In some embodiments, the apparatus may include a scanning probe nanolithography system and any of the devices described above, wherein the device is mounted to the scanning probe nanolithography system. A variety of instruments including scanning probe nanolithography systems may be used, including, but not limited to the DPN 5000, NLP 2000, and the NSCRIPTOR systems commercially available from NanoInk, Inc. Skokie, Ill. The term "scanning probe nanolithography system" can include other scanning probe microscope systems that may be adapted for nanolithography. Such scanning probe microscope systems include, but are not limited to scanning tunneling microscopes, atomic force microscopes, and near-field optical scanning microscopes. Such scanning probe microscope systems are commercially available. Environmental chambers can be included on the instruments to control, for example, temperature, humidity, and gas content.

Figure 5:
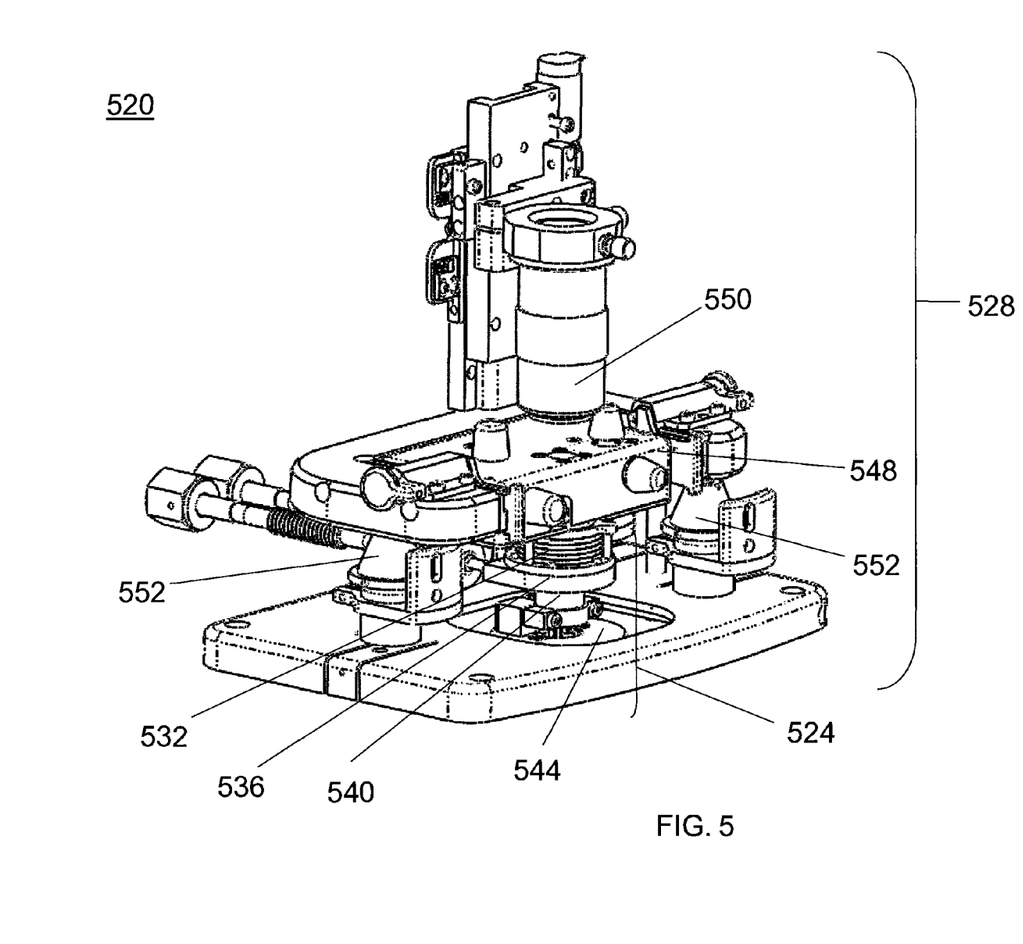
FIG. 5 is a view of an assembled, exemplary embodiment of an apparatus including a scanning probe nanolithography system and a device for performing scanning probe nanolithography, one or more surface modification methods, or combinations thereof.

FIG. 5 shows an exemplary embodiment of an apparatus 520 including the assembled device 524 of FIG. 2 (element 200) mounted to a scanning probe nanolithography system 528 through the nanopositioning stage located at the bottom of the scanner assembly 548. As described above, the device 524 may be mounted using screws (see element 227 in FIG. 2). The device 524 includes the reaction chamber 532, the scanning probe tip assembly (not shown, enclosed in the reaction chamber), the gas plate assembly 536, the substrate assembly 540, and the base assembly 544. The base assembly 544 may be mounted to the XY stage (not shown) of the system 528. The scanning probe nanolithography system 528 also includes a microscope lens 550 and scanner leveling stages 552 (one of which is not shown).

A variety of accessories may be coupled to the disclosed apparatuses. Suitable accessories include, but are not limited to a vacuum pump, a gas manifold, a mass flow controller, pressure transducers, computers, direct voltage/current sources, alternating voltage/current sources, high voltage sources, and RF generators. Such accessories, as well as means for coupling the accessories to scanning probe nanolithography systems are known.

through the ports 550 on the gas plate assembly 536 at a variety of pressures maintained by a vacuum pump coupled to one of the ports 550. The temperature of the substrate may be controlled through the application of heat to the substrate via a heating element in the substrate assembly 540. In addition, the temperature of the scanning probe tips may be controlled by heating elements coupled to the tips. As discussed above, the volume of the reaction chamber 532 may be small enough to enable the reaction conditions (e.g., the gas composition and temperature) to be changed very quickly, an advantage for the several of the surface modification methods described above. Similarly, the rapid change of reaction conditions facilitates switching between each of the methods disclosed herein.

The devices and apparatuses disclosed herein may be used to fabricate a variety of nanostructures on surfaces of substrates using scanning probe epitaxy (SPE). SPE uses scanning probe tips to direct the atom-by-atom construction of a variety of nanostructures, including, but not limited to quantum dots (QDs), nanowires (NWs), and carbon nanotubes (CNTs). In SPE, reactions either occur on a substrate, where reagents are delivered to the substrate from the tip, or in the gas phase, where catalysts on the tip react with the gases, resulting in precisely oriented and positioned nanostructures on the surface. Table 1, below, summarizes exemplary environmental conditions for fabricating exemplary nanostructures. The devices and apparatuses disclosed herein are capable of providing these and other environmental conditions.

TABLE 1

Exemplary synthesis conditions for a variety of nanostructures.

|  | QDs | CNTs |  | Semiconductor Nanowires |
| --- | --- | --- | --- | --- |
| Non-limiting examples | CdS, CdSe | Single Walled | Si | InP |
| Catalytic Nanoparticles | / | Fe, Ni, Co, etc. | Au | Bi |
| Temperature (° C.) | >200 | >550 | >400 | 240-300 |
| Controlled Environment | Organometallic precursors; inert or ambient atmosphere | Hydrocarbon ($CH_4$, $C_2H_2$, $C_2H_5OH$, etc.); carrier gas (e.g., Ar) | $SiH_4$ and $H_2$ | Polydecene solutions of $In(myristate)_3$ and $P(SiMe_3)_3$ |

Methods

In another aspect, methods for using any of the disclosed devices and apparatuses are provided. In a basic embodiment, a method may include providing any of the disclosed devices or disclosed apparatuses and modifying a substrate mounted to the substrate assembly. The step of modifying the substrate may include modifying the substrate by dip pen nanolithography, chemical vapor deposition, atomic layer deposition, rapid thermal annealing, reactive ion etching, other similar methods, or combinations thereof. In some embodiments, the step of modifying the substrate includes modifying the substrate by dip pen nanolithography, chemical vapor deposition, or both.

As described above, the general parameters for dip pen nanolithography and the other surface modification methods are known, although devices and apparatus for performing various combinations of these methods are not. However, the disclosed devices and apparatuses are well-adapted for performing such methods. With reference to FIG. 5, gas-phase reactants may be supplied to the reaction chamber 532

Kits

One or more of the components and devices described herein can be combined into useful kits. The kits can further comprise one or more instructions on how to use the kit. The kit can be, for example, adapted to function with an instrument such as an existing commercial instrument.

Applications

The devices, apparatuses, and instruments described herein can be used for a variety of applications, including both imaging and fabrication, including nanolithography and direct write patterning.

For example, one area of application is MEMS and NEMS. The acronym "MEMS" can encompass all microsystems, such as microelectromechanical, microelectrooptical, microelectromagnetic, and microfluidic systems. MEMS also can include nanoelectromechanical systems, NEMS.

Applicants exist in nanoscale modifications. The term "nanoscale modification" can refer to modification of a substrate on the nanometer scale, e.g., structures less than one micron in one, two, or three dimensions, or less than 100 nm in one, two, or three dimensions. Nanoscale modification can encompass a variety of techniques, including, but not limited to scanning probe nanolithography, such as DPN™, and surface modification methods. Nanoscale modification can be distinguished from simply imaging the surface of a substrate using scanning probe microscopes. The term "surface modification methods" can include, but is not limited to, methods such as Chemical Vapor Deposition (CVD), Atomic Layer Deposition (ALD), Rapid Thermal Processing (RTP), and Reactive Ion Etching (RIE). Each of these techniques is further described below.

DPN™ deposition and printing methods are disclosed, for example, in (1) U.S. Pat. Pub. No. 2002/0063212 A1 published to Mirkin et al. on May 30, 2002 and (2) U.S. Pat. Pub. No. 2002/0122873 A1 published to Mirkin et al. on Sep. 5, 2002, the complete disclosures of which are hereby incorporated by reference, particularly for the experimental parameters for the nanolithography, including substrates, inks, patterning compounds, tips, instrumentation, software, and the like. Variants of DPN printing can be carried out including, for example, thermal DPN or DPN used with hollow tips.

Chemical Vapor Deposition (CVD) is a known technique. See, e.g., Dobkin, D. M. et al, *Principles of Chemical Vapor Deposition*, Kluwer Academic Publishers, 2003. CVD is a process by which thin films are deposited on the surface of a substrate using gaseous precursor molecules. A CVD apparatus may include a reaction chamber; ports for gaseous reactants and byproducts; a vacuum system; and a variable amplifier to deliver DC bias as well as AC voltage, modulated or in pulses of energy to drive the deposition. CVD reactions may be carried out at temperatures from about 200° C. to about 700° C.

Atomic Layer Deposition, or Atomic Layer Epitaxy (ALE), is also known. See, e.g., Sree Harsha, K. S., *Principles of Physical Vapor Deposition of Thin Films*, Elsevier Ltd., 2006. ALD is another technique for depositing thin films of materials onto substrates using gaseous precursor molecules. Like CVD, an ALD apparatus may include a reaction chamber; ports for gaseous reactants and byproducts; a vacuum system; and a variable source of voltage and current to drive the deposition. ALD reactions may be carried out at temperatures from about 200° C. to about 400° C.

Rapid thermal processing is another known technique. See, e.g., Fair, R. B., *Rapid Thermal Processing: Science and Technology*, Academic Press, Inc., 1993. RTP refers to a collection of semiconductor manufacturing processes in which substrates are heated to high temperatures (from about 200° C. to about 1300° C.) for short periods of times (from about 1 to about 2 minutes). A RTP apparatus may include a reaction chamber and a source of heat. Certain types of RTP may also include ports for gases and a vacuum system.

One type of RTP is Rapid Thermal Annealing (RTA), which may be used to activate dopants, alter film-to-film or film-to-wafer substrate interfaces, densify deposited films, change states of grown films, repair damage from ion implantation, move dopants or drive dopants from one film into another or from a film into a wafer substrate. In many cases, the high temperatures are applied for very short times in order to minimize unwanted diffusion of surface species. In other cases, it may be useful to maintain substrates in a very pure gas ambient in order to minimize oxidation.

Another type of RTP is Rapid Thermal Oxidation (RTO), which may be used to oxidize substrate surfaces by providing the appropriate gas ambients to the substrate. Similarly, Rapid Thermal Nitridation (RTN) may be used to nitridate substrate surfaces. By way of example only, RTN of a $SiO_2$ surface in an ammonia ambient results in the nitridation of the $SiO_2$ surface.

Reactive Ion Etching, a process which uses a chemically reactive plasma to remove material deposited on a substrate, is also known. See, e.g., Rossnagel, S. M. et al, *Handbook of Plasma Processing Technology: Fundamental, Etching, Deposition and Surface Interactions*, Noyes Publications, 1990. A RIE apparatus may include a reaction chamber; ports for gases; a vacuum system; and a high energy RF generator to excite the plasma (e.g., a radio-frequency electromagnetic field).

Methods of Making and Assembling

Methods known in the art can be used to make and assemble components and devices. This includes adapting the components and devices with commercial instrumentation.

What is claimed is:

1. A device comprising:
   a reaction chamber adapted for nanoscale modification of a substrate and vacuum conditions;
   a scanning probe tip assembly enclosed within the reaction chamber, the scanning probe tip assembly comprising one or more tips;
   a first port coupled to the reaction chamber for delivering a gas;
   a second port coupled to the reaction chamber for applying a vacuum; and
   a substrate assembly insertedly mounted to the reaction chamber,
   wherein the reaction chamber comprises a body having one or more flexible walls adapted to accommodate the movement of the scanning probe tip assembly.

2. The device of claim 1, wherein the reaction chamber comprises a body having one or more flexible, corrugated walls adapted to accommodate the movement of the scanning probe tip assembly.

3. The device of claim 1, wherein the reaction chamber is adapted to be stable to a corrosive gas.

4. The device of claim 1, wherein the flexible walls comprise stainless steel, silicon, or polydimethylsiloxane.

5. The device of claim 1, wherein the flexible walls comprise stainless steel.

6. The device of claim 1, wherein the reaction chamber further comprises one or more supports mounted to the outside of the reaction chamber to prevent the reaction chamber from collapsing under the vacuum.

7. The device of claim 1, wherein the reaction chamber further comprises one or more rods mounted to the outside of the reaction chamber to prevent the reaction chamber from collapsing under the vacuum.

8. The device of claim 1, wherein at least a portion of the substrate assembly is outside of the reaction chamber.

9. The device of claim 1, wherein the reaction chamber further comprises a cap portion mounted to a first end of the body and a base portion mounted to a second, opposite end of the body.

10. The device of claim 9, wherein the base portion comprises an aperture through which the substrate assembly is insertedly mounted.

11. The device of claim 9, wherein the scanning probe tip assembly is mounted to the cap portion.

12. The device of claim 9, wherein the cap portion comprises a transparent window.

13. The device of claim 1, further comprising an electrical conduit coupling the one or more tips to one or more electrical components outside the reaction chamber.

14. The device of claim 1, further comprising one or more pins protruding from the outside of the reaction chamber, the one or more pins in electrical contact with the one or more tips and with one or more electrical components outside the reaction chamber.

15. The device of claim 1, wherein the reaction chamber comprises
a cap portion mounted to a first end of the body;
a base portion mounted to a second end of the body, the base portion comprising an aperture through which the substrate assembly is insertedly mounted;
one or more supports to prevent the reaction chamber from collapsing under the vacuum, the one or more supports mounted to the cap portion and the base portion and positioned outside of the reaction chamber; and
one or more pins protruding through the cap portion and outside of the reaction chamber, the one or more pins in electrical contact with the one or more tips and one or more electrical components outside the reaction chamber.

16. The device of claim 1, wherein the volume of the reaction chamber is about 1 cubic inch or less.

17. The device of claim 1, wherein the nanoscale modification comprises one or more of dip pen nanolithography, chemical vapor deposition, atomic layer deposition, rapid thermal annealing, or reactive ion etching.

18. The device of claim 1, further comprising a gas plate assembly mounted to the reaction chamber, wherein the gas plate assembly comprises the first port and the second port.

19. The device of claim 1, further comprising an o-ring for forming a seal between the reaction chamber and the mounted gas plate assembly, the seal capable of maintaining the vacuum.

20. The device of claim 18, wherein the gas plate assembly further comprises a first hose assembly mounted to the first port and a second hose assembly mounted to the second port.

21. The device of claim 18, wherein the gas plate assembly further comprises a top surface, the top surface comprising one or more openings adapted to allow the gas to pass.

22. The device of claim 18, wherein the gas plate assembly further comprises an aperture through which the substrate assembly is insertedly mounted.

23. The device of claim 18, wherein the gas plate assembly further comprises a channel on an inner surface of the aperture and an o-ring in the channel for forming a seal between the gas plate assembly and the mounted substrate assembly, the seal capable of maintaining the vacuum.

24. The device of claim 1, wherein the substrate assembly comprises a body having an end and a platform for mounting a substrate, the platform disposed at the end of the body.

25. The device of claim 24, wherein the substrate assembly further comprises a heating element for heating the substrate, the heating element mounted to the body.

26. The device of claim 24, wherein the substrate assembly further comprises a heating element for heating the substrate to a temperature of 200° C. or greater, the heating element mounted to the body.

27. The device of claim 24, wherein the substrate assembly further comprises a heating element for heating the substrate and a temperature sensor, the heating element and the temperature sensor mounted to the body.

28. The device of claim 24, wherein the substrate assembly further comprises a heating element for heating the substrate and a thermocouple, the heating element and the thermocouple mounted to the body.

29. The device of claim 25, further comprising an insulating sleeve disposed around the body.

30. The device of claim 25, further comprising an insulating washer disposed around the heating element.

31. The device of claim 29, further comprising a housing disposed around the insulating sleeve.

32. The device of claim 1, wherein the substrate assembly comprises:
a body having an end and a platform for mounting the substrate, the platform disposed at the end of the body;
a heating element for heating the substrate, the heating element mounted to the body;
an insulating sleeve disposed around the body;
an insulating washer disposed around the heating element; and
a housing disposed around the insulating sleeve.

33. The device of claim 1, further comprising a base assembly mounted to the substrate assembly, the base assembly adapted to adjust and maintain a height of the substrate assembly within the reaction chamber.

34. The device of claim 33, wherein the base assembly comprises a base portion adapted to support the substrate assembly on a horizontal surface and an adjustable mounting portion, the adjustable mounting portion comprising an aperture through which the substrate assembly may be insertedly mounted.

35. A device comprising:
a reaction chamber adapted for nanoscale modification of a substrate and vacuum conditions;
a tip assembly enclosed within the reaction chamber, the tip assembly comprising one or more tips;
a first port coupled to the reaction chamber for delivering a gas;
a second port coupled to the reaction chamber for applying a vacuum; and
a substrate assembly insertedly mounted to the reaction chamber,
wherein the reaction chamber comprises a body having one or more flexible walls adapted to accommodate the movement of the tip assembly.

36. A device comprising:
a reaction chamber adapted for nanoscale modification of a substrate and vacuum conditions, the reaction chamber comprising
a body having one or more flexible walls adapted to accommodate the movement of a scanning probe tip assembly,
a cap portion mounted to a first end of the body, and
a base portion mounted to a second, opposite end of the body, the base portion comprising a first aperture;
the scanning probe tip assembly enclosed within the reaction chamber, the scanning probe tip assembly comprising one or more tips;
a gas plate assembly mounted to the base portion of the reaction chamber, the gas plate assembly comprising
a first port for delivering a gas,
a second port for applying a vacuum, and
a second aperture;
a substrate assembly insertedly mounted through the first and second apertures; and
a base assembly mounted to the substrate assembly, the base assembly adapted to adjust and maintain a height of the substrate assembly within the reaction chamber.

37. The device of claim 36, wherein the reaction chamber further comprises one or more supports mounted to the outside of the reaction chamber to prevent the reaction chamber from collapsing under the vacuum.

38. The device of claim 36, wherein the reaction chamber further comprises one or more rods mounted to the outside of the reaction chamber to prevent the reaction chamber from collapsing under the vacuum.

39. The device of claim 36, wherein the flexible walls comprise stainless steel.

40. The device of claim 36, further comprising an electrical conduit coupling the one or more tips to one or more electrical components outside the reaction chamber.

41. The device of claim 36, further comprising one or more pins protruding from the outside of the reaction chamber, the one or more pins in electrical contact with the one or more tips and with one or more electrical components outside the reaction chamber.

42. The device of claim 36, wherein the volume of the reaction chamber is about 1 cubic inch or less.

43. The device of claim 36, wherein the nanoscale modification comprises one or more of dip pen nanolithography, chemical vapor deposition, atomic layer deposition, rapid thermal annealing, or reactive ion etching.

44. The device of claim 36, wherein the substrate assembly comprises
a body having an end;
a platform for mounting the substrate, the platform disposed at the end of the body; and
a heating element for heating the substrate, the heating element mounted to the body.

45. An apparatus comprising the device of claim 36 and a scanning probe nanolithography system, wherein the device is mounted to the scanning probe nanolithography system.

46. An apparatus comprising:
a scanning probe nanolithography system, and
a device mounted to the scanning probe nanolithography system, the device comprising
a reaction chamber adapted for nanoscale modification of a substrate and vacuum conditions;
a scanning probe tip assembly enclosed within the reaction chamber, the scanning probe tip assembly comprising one or more tips;
a first port coupled to the reaction chamber for delivering a gas;
a second port coupled to the reaction chamber for applying a vacuum; and
a substrate assembly insertedly mounted to the reaction chamber,
wherein the reaction chamber comprises a body having one or more flexible walls adapted to accommodate the movement of the scanning probe tip assembly.

* * * * *